United States Patent [19]

Bell et al.

[11] Patent Number: 4,651,215

[45] Date of Patent: Mar. 17, 1987

[54] IMAGE SENSORS

[75] Inventors: Raymond T. Bell, Middlesex; Christopher J. Morcom, Surrey, both of England

[73] Assignee: The General Electric Company, p.l.c., England

[21] Appl. No.: 772,717

[22] Filed: Sep. 5, 1985

Related U.S. Application Data

[63] Continuation-in-part of Ser. No. 610,858, May 16, 1984, abandoned.

[30] Foreign Application Priority Data

May 24, 1983 [GB] United Kingdom ................. 8314300

[51] Int. Cl.[4] .......................... H04N 3/14; H01L 27/14
[52] U.S. Cl. ..................................................... 358/213
[58] Field of Search .............................. 358/212, 213; 357/24 LR

[56] References Cited

U.S. PATENT DOCUMENTS 3,931,463  1/1976  Levine .................................. 358/213
4,245,164  1/1981  Funahashi ...................... 357/24 LR
4,577,115  3/1986  Rentsch et al. ..................... 250/578

FOREIGN PATENT DOCUMENTS 0026380  4/1981  European Pat. Off. ..
1464391  2/1977  United Kingdom .
2083968  3/1982  United Kingdom .
2112603  7/1983  United Kingdom .
2119567  11/1983  United Kingdom .

Primary Examiner—Gene Z. Rubinson
Assistant Examiner—Stephen Brinich
Attorney, Agent, or Firm—Kirschstein, Kirschstein, Ottinger & Israel

[57] ABSTRACT

A CCD frame transfer image sensor wherein the effective integration period can be shortened by electrical means. The sensor comprises an image section having a first photo-sensitive portion of an array of CCD channels and a store section having a second light shielded portion of the array. Means are provided for controlling the potentials applied to the control electrodes of the array so as to transfer along the channels charge generated in the image section into a charge sink structure during one of the active line periods at a frequency outside the bandwidth of the output signal of the sensor.

8 Claims, 7 Drawing Figures

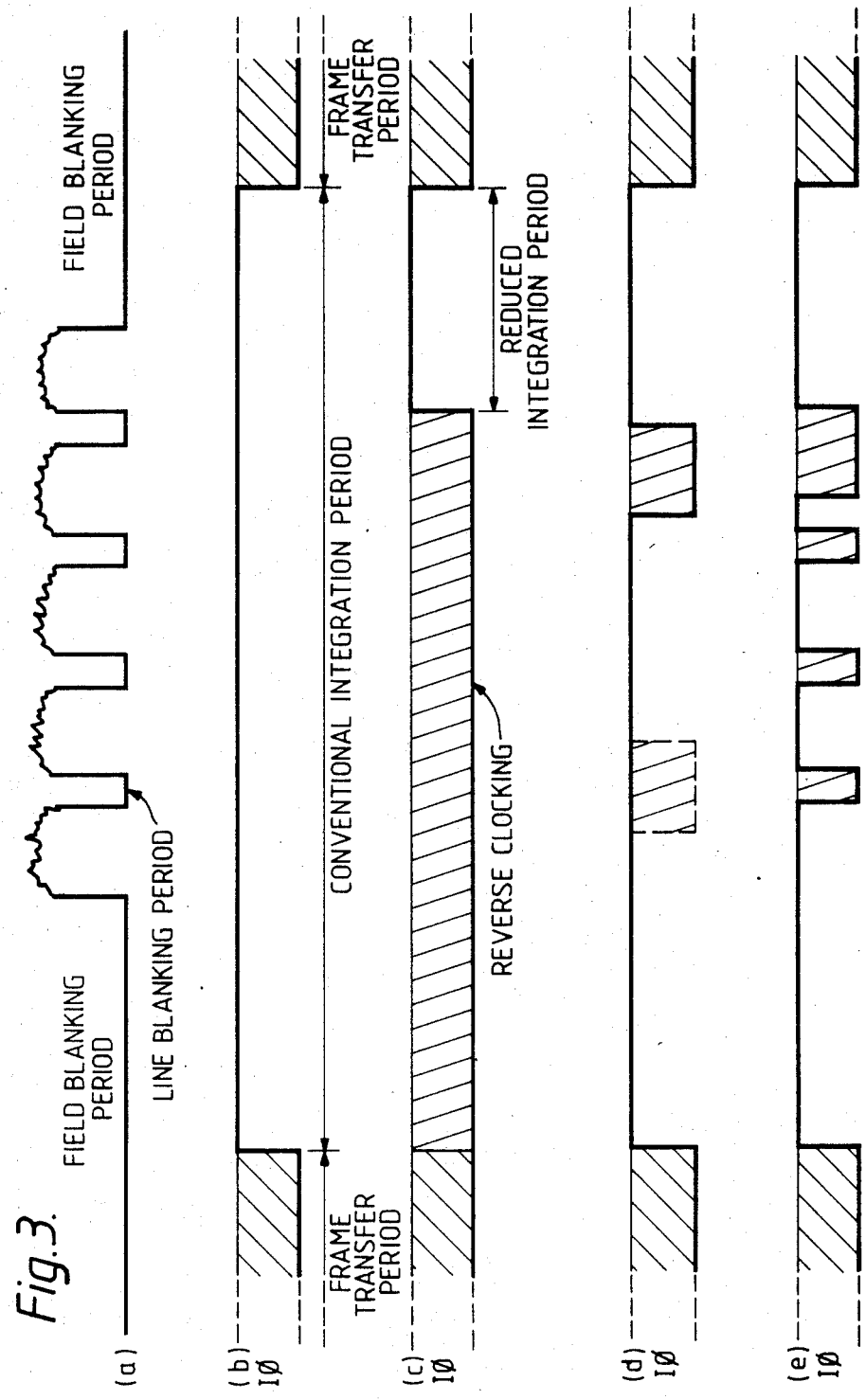

IMAGE SENSORS

CROSS-REFERENCE TO RELATED APPLICATION

This application is a continuation-in-part of U.S. patent application Ser. No. 610,858 filed May 16, 1984 for improvements in or relating to image sensors now abandoned.

BACKGROUND OF THE INVENTION

1. Field of the Invention

This invention relates to image sensors. In particular the invention relates to charge coupled device (CCD) frame transfer image sensors.

2. Description of Related Art

In CCD frame transfer image sensors, light representing an image is focussed onto a first photosensitive portion of an array of CCD channels comprising an image section of the array. A second portion of the array of CCD channels which is non photosensitive, e.g. due to being shielded from light, comprises a store section. Adjacent to the store section there is provided a line read-out section. A frame of charge photogenerated in the image section is transferred to the store section by applying clock pulses to the control electrodes of both sections and then read out in sequential line-by-line fashion by applying clock pulses to the control electrodes of both store and line read-out sections to form an image on for example, a television screen. Normally a frame of charge is read out of the store section as a further frame is being collected in the image section, and so on. Thus the 'integration period' during which a frame of photo-generated charge is collected in the image section of the sensor can not normally be shorter than the time taken to read out the previous frame of charge from the store section. The read out time is often fixed to conform to a given output standard, for example in conventional 525/625 line television, and is, in any case, limited by the physical constraints of the device structure, for example the speed of charge transfer. This then precludes the use of the very short integration periods which may be a desirable feature in such applications as the imaging of fast moving objects, or in high illumination situations, unless a mechanical shutter, with all its attendant problems of mechanical unreliability, is employed in front of the sensor.

In U.S. Pat. No. 3,931,463 there is described a CCD frame transfer image sensor for a television wherein the effective integration period can be shortened by electrical means.

The CCD frame transfer image sensor described in that patent comprises: an image section comprising a photo-sensitive portion of an array of CCD channels, a store section comprising a non photo-sensitive portion of said array of CCD channels; a line read-out section adjacent to the store section with a control electrode structure being associated with said image, store, and read out sections. A charge sink structure is provided at the end of said CCD channels remote from the store section of the sensor. Means are provided for applying potentials to the control electrode structure so as to transfer charge generated in the image section along the channels in either direction, i.e. either into the store section to be read out via said read-out section, or into the charge sink structure thereby to control the period for which charge is collected in the image section before transfer to the store section.

In the sensor described in U.S. Pat. No. 3,931,463 reverse clocking pulses effective to transfer charge into the charge sink structure are applied during the horizontal retrace periods of the television. This avoids spurious patterning of the picture obtained from the output signal due to parasitic pickup of the reverse clocking waveform in the output signal. Such a technique suffers the disadvantage however that it is often not possible to apply sufficient reverse clocking pulses during each horizontal retrace period to totally transfer the required charge to the charge sink. Thus as in each horizontal retrace period any photocharge collected in the preceding line time is moved towards the charge sink where there are insufficient reverse clocking pulses applied a residue of photocharge will be left, displaced vertically from its original position. After successive line periods, as further photocharge is superimposed on the displaced residual charge from the preceding reverse clocking, a pattern of multiple images is created separated by a number of CCD lines equivalent to the number of reverse clocking pulses applied during each horizontal retrace period. Whilst for some applications the horizontal retrace period is long enough to allow all photocharge in the image section to be dumped such that multiple images will not occur, for many applications such as 525/625 line TV this is not possible, and the formation of multiple images is a major disadvantage.

SUMMARY OF THE INVENTION

A sensor in accordance with the present invention overcomes this problem by arranging for the reverse clocking pulses to be applied during an active line period at a frequency outside the bandwidth of the output signal.

This frequency is preferably equal to the frequency of clocking of the line read-out section.

Preferably reverse clocking pulses are additionally applied during the periods between the active line periods.

BRIEF DESCRIPTION OF THE DRAWINGS

Two CCD frame transfer image sensors in accordance with the invention will now be described, by way of example only, with reference to the accompanying drawings in which:

FIG. 3(a) represents the read-out signal of the store section of the first sensor;

FIG. 3(b) represents the clocking signal applied to the CCD channels of the image section of a sensor not including electronic means for varying the integration period;

FIG. 3(c) illustrates the general principle of reverse clocking;

FIG. 3(d) represents the clocking signal applied to the CCD channels of the image section of the first sensor, and FIG. 3(e) represents the clocking signal applied to the CCD channels of the image section of the second sensor.

DETAILED DESCRIPTION OF THE PREFERRED EMBODIMENTS

Figure 1:
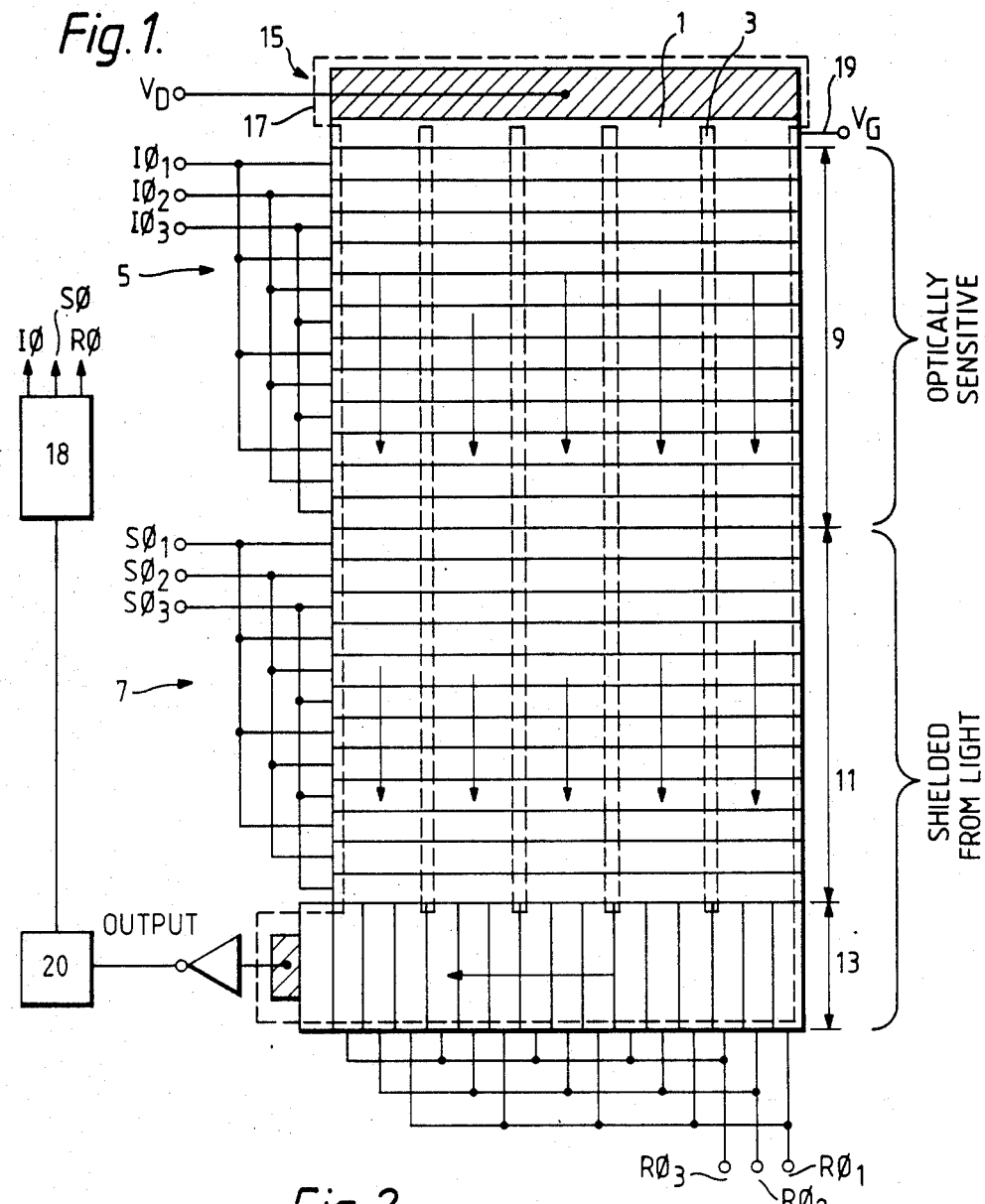
FIG. 1 shows a schematic diagram of the first sensor.

Referring firstly to FIG. 1, the first sensor includes an array having five charge transfer CCD channels 1 arranged side by side. The array is fabricated in known manner on a silicon substrate, adjacent channels being isolated from each other by channel stop regions in the substrate, represented by dotted lines 3 in FIG. 1. Charge storage elements within each channel 1 are defined by a three-phase electrode structure 5, 7, the storage elements within the channels being aligned to form a rectangular array of charge storage elements. One half of the array, the upper half in FIG. 1, is open to incoming light, and forms the image section 9 of the sensor, whilst the other half of the array, the lower half in FIG. 1, is shielded from the light, and forms the store section 11 of the sensor. At one end of the store section 11, the lower end in FIG. 1, there is a line read out section 13. The sensor also includes clock pulse generating means 18 effective to apply clock pulses to the electrode structure of the image, store and read-out sections.

In use an optical image is focussed onto the image section 9 of the sensor, and a charge pattern corresponding to the image is generated by the photoelectric effect in the storage elements underlying the image. In conventional sensors a frame of charge thus generated over a period of time, the integration period, in the charge storage elements of the image section 9, is, by application of clock pulses $I\phi_1$, $I\phi_2$, $I\phi_3$ to the electrode structure 5 and clock pulses $S\phi_1$, $S\phi_2$ and $S\phi_3$ to the electrode structure 7, transferred quickly to the store section 11. This is then read out sequentially line by line, through the line read-out section 13 by application of further clock pulses $S\phi_1$, $S\phi_2$, $S\phi_3$, to the store section electrode structure 7, and $R\phi_1$, $R\phi_2$, $R\phi_3$, to the read-out section electrode structure.

An output signal of the form shown in FIG. 3(a) is thus obtained comprising a number of active line periods corresponding to the periods during which signals for successive lines are read out from the read-out section. Separating the active line periods are periods of zero output known as line blanking periods corresponding to the periods during each of which a line of charge is transferred from the store section to the read-out section.

Periods of zero output, known as frame blanking periods also occur between the signals for successive frames, during which there occurs a period during which a frame of charge is transferred from the image section to the store section, i.e. a frame transfer period.

It will be understood that for each frame of charge the time available for charge generation, i.e. the integration period, is the period between successive frame transfer periods, as illustrated in FIG. 3(b). In CCD image sensors not incorporating means for varying the integration period, the integration period comprises substantially the whole of this available period.

Figure 2:
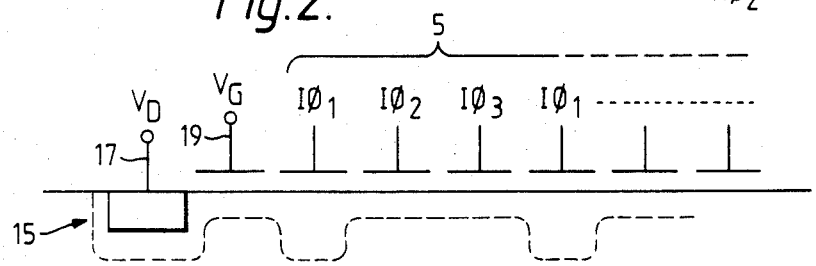
FIG. 2 shows a cross-section along part of the length of one of the CCD channels of the image section of the first sensor.

Referring now also to FIG. 2, the sensor further includes a charge sink structure comprising an appropriately doped layer forming a p-n junction at the end of the image section of the array further from the store section, adjacent to the end storage elements of the channels 1. Interposed on the surface of the substrate between an electrode 17 provided to the junction 15 and the first electrode of the electrode structure 5 is an additional electrode 19. In addition, the clock pulse generating means 18 is arranged so as to enable the electrode structure 5 of the image section to be clocked in reverse sequence during the conventional integration period as well as in the normal forward sequence during the frame transfer period. When the electrode structure is reverse clocked, if the p-n junction 15 is held under sufficient reverse bias ($V_D$), charge photo-generated in the image section 9 will be transferred up the image section to be dumped in the sink formed by the junction 15, or when the reverse clocking stops, the effective integration period will then be the remainder of the conventional integration period before frame transfer to the store 11 takes place, as shown in FIG. 3(c). Thus control of the effective integration time is achieved by choosing the time at which the reverse clocking stops. The electrode 19 is held at a fixed bias $V_G$ to isolate the sink from the CCD when charge dumping is not required.

Whilst the reverse clocking sequence described hereinbefore illustrates the general principle of reverse clocking, the actual sequence used in the first sensor is shown in FIG. 3(d). The sensor includes means for applying reverse clocking pulses for one active line time just before the start of the integration period at a frequency outside the output signal bandwidth. As clocking at a high frequency can cause problems with excessive power dissipation, since the power dissipation of the electronic circuitry generating the clock pulses is proportional to frequency, reverse clocking will be relatively infrequent so that this extra power dissipation will be minimised. It is advantageous to apply the reverse clocking at the same frequency as the frequency of clocking of the read-out section, as low frequency alias components formed between the reverse clocking frequency and the frequency of the line read-out will then be at d.c. and appear merely as a shift of the black level in the video output, which is relatively easy to compensate. Such a reverse clocking sequence may suffer the disadvantage however under conditions of optical overload, one line time of reverse clocking at the same frequency as the clocking line frequency of the read-out section is insufficient to dump all the charge which has been accumulated in the image section of the CCD. Furthermore such an amount of photo-charge may be generated in the image section before the reverse clocking, that there is a charge overflow into the top of the store section. Although it is possible to completely sweep the image section of charge by extending the reverse clocking period into further active line periods as for example shown in dotted lines in FIG. 3(d), this will have the disadvantage that the number of lines effected by the d.c. alias components is increased, and also that any excess charge which has flowed into the store section cannot be removed. The second sensor to be described is of the same form as the first sensor described above but overcomes this problem by including means for applying the reverse clocking sequence illustrated in FIG. 3(e) in which reverse clocking is employed firstly during the line blanking intervals to prevent an excess of photo-charge accumulating in the image section, and then for one active line time prior to the start of the integration period, all the pulses being applied at the frequency of clocking of the line read-out section although the frequency is not critical for the pulses applied during the line blanking periods.

It will be appreciated that whilst the sensors described herebefore have, for sake of clarity, only five charge transfer channels 1 and a limited number of elements, a practical sensor would have many more channels and elements. In such a sensor with 385×576 elements for use in a 625 line TV compatible camera, a variation of integration period from the nominally 20 ms of the conventional approach down to less than 1 ms has been demonstrated.

If suitable circuitry such as that indicated as 20 in FIG. 1 is used to sense the mean or peak level of the output signal of the sensor and a control loop set up to control the time at which reverse clocking of the image section stops, and hence the integration period on a continuous basis to keep the output at a fixed mean level, what is described on film cameras as automatic exposure control may be achieved.

We claim:

1. A CCD frame transfer image sensor comprising: an image section comprising a photo-sensitive portion of an array of CCD channels, a store section comprising a non photo-sensitive portion of said array of CCD channels; a line read-out section adjacent to the store section; first, second and third control electrode structures respectively associated with said image, store, and read-out sections; a charge sink structure; and means for applying potentials to the control electrode structures so as to transfer charge generated in the image section along the channels into the store section during a frame transfer period and to read out charge stored in said store section via said read-out section during successive active line periods to provide an output signal, said means for applying potentials further applying potentials to the first control electrode structure so as to transfer charge generated in the image section along the channels into the charge sink structure during an active line period at a frequency outside the bandwidth of the output signal of the sensor, thereby to control the period for which charge is collected in the image section before transfer to the store section.

2. A sensor according to claim 1 in which said frequency is equal to the frequency of the potentials applied to the third control electrode structure.

3. A sensor according to claim 1 in which said active line period is the last active line period before said period for which charge is collected in the image section before transfer to the store section.

4. A sensor according to claim 1 in which said means for applying potentials applies further potentials to said first control electrode structure effective to transfer said charge into said charge sink structure during the periods between the active line periods.

5. A sensor according to claim 1 in which said charge sink structure is disposed at the end of said CCD channels remote from the store section of the sensor, the image section portion of the array of CCD channels and the first electrode structure being arranged so that charges may be transferred in either direction along said channels, and said means for applying potentials to the first control electrode structure comprises means for controlling the potentials so as to transfer charge along the CCD channels in a direction towards or away from said sink structure.

6. A sensor according to claim 1 in which said charge sink structure is a p-n junction.

7. A sensor according to claim 1 in which said means for applying the potentials includes means for controlling the periods for which said potentials are applied to transfer charge into said charge sink, thereby to vary the effective charge integration time.

8. A sensor according to claim 7 wherein said means for controlling said period comprises means for sensing the level of the output signal of the sensor and means for controlling said periods in dependence on the level of said output signal, thereby to tend to maintain said level substantially constant.

* * * * *